United States Patent [19]

Jayaraman et al.

[11] Patent Number: 5,284,737

[45] Date of Patent: Feb. 8, 1994

[54] PROCESS OF DEVELOPING AN IMAGE UTILIZING POSITIVE-WORKING RADIATION SENSITIVE MIXTURES CONTAINING ALKALI-SOLUBLE BINDER, O-QUINONEDIAZIDE PHOTOACTIVE COMPOUND AND BLANKOPHOR FBW ACTINIC DYE

[75] Inventors: Tripunithura V. Jayaraman, East Greenwich; David J. Brzozowy, Lincoln, both of R.I.

[73] Assignee: OCG Microelectronic Materials, Inc., West Paterson, N.J.

[21] Appl. No.: 108,266

[22] Filed: Aug. 19, 1993

Related U.S. Application Data

[62] Division of Ser. No. 891,011, Jun. 1, 1992.

[51] Int. Cl.$^5$ ............................ G03F 7/30; G03F 7/023
[52] U.S. Cl. ..................................... 430/326; 430/512
[58] Field of Search ............... 430/165, 191, 272, 275, 430/277, 278, 512, 326, 325

[56] References Cited

U.S. PATENT DOCUMENTS

| | | | |
|---|---|---|---|
| 3,525,618 | 8/1970 | Keller et al. | 430/157 |
| 3,558,316 | 1/1971 | Keberle et al. | 430/139 |
| 3,615,551 | 10/1971 | Farnley | 430/538 |
| 5,001,040 | 3/1991 | Blakeney et al. | 430/191 |

OTHER PUBLICATIONS

Miles Product Information Sheet on Blankophor FBW, T.D.S. No. 1592/2 dated Mar., 1990.

Primary Examiner—Charles L. Bowers, Jr.
Assistant Examiner—Christopher G. Young
Attorney, Agent, or Firm—William A. Simons

[57] ABSTRACT

A radiation-sensitive composition comprising an admixture in a solvent of: at least one alkali-soluble binder resin, at least one photoactive compound and an effective absorbance increasing amount of BLANKOPHOR FBW actinic dye; the amount of said binder resin being about 60 to 95% by weight, the amount of said photoactive component being about 5% to about 40% by weight, based on the total solids content of said radiation-sensitive composition.

5 Claims, No Drawings

PROCESS OF DEVELOPING AN IMAGE UTILIZING POSITIVE-WORKING RADIATION SENSITIVE MIXTURES CONTAINING ALKALI-SOLUBLE BINDER, O-QUINONEDIAZIDE PHOTOACTIVE COMPOUND AND BLANKOPHOR FBW ACTINIC DYE

This application is a division of application Ser. No. 07/891,011 filed Jun. 1, 1992, now allowed.

BACKGROUND OF THE INVENTION

1. Field of the Invention

The present invention relates to radiation sensitive mixtures (e.g., those particularly useful as dyed i-line positive-working resist compositions) containing the admixture of an alkali-soluble binder resin, a photoactive compound, and BLANKOPHOR FBW actinic dye all dissolved in a solvent. Furthermore, the present invention also relates to substrates coated with these radiation sensitive mixtures as well as the process of coating, imaging and developing these radiation sensitive mixtures on these substrates.

2. Brief Description of Prior Art

Photoresist compositions are used in microlithographic processes for making miniaturized electronic components such as in the fabrication of integrated circuits and printed wiring board circuitry. In these processes, a thin coating or film of a photoresist composition is generally first applied to a substrate material, such as silicon wafers used for making integrated circuits or aluminum or copper plates of printed wiring boards. The preferred method of applying this film is spin coating. By this method, much of the solvent in the photoresist formulation is removed by the spinning operation. The coated substrate is then baked to evaporate any remaining solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, ion beam, and X-ray radiant energy are radiation types commonly used today in microlithographic processes.

After this image-wise exposure, the coated substrate is treated with a developer solution to dissolve and remove either the radiation-exposed or the unexposed areas of the coated surface of the substrate. In some processes, it is desirable to bake the imaged resist coating before this developing step. This intermediate step is sometimes called post-exposure bake or PEB.

There are two types of photoresist compositions—negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited but not exposed to the radiation. On the other hand, when positive-working photoresist compositions are exposed image-wise to radiation, those areas of the resist composition exposed to the radiation become more soluble to the developer solution (e.g., the Wolff rearrangement reaction of the photoactive compound occurs) while those areas not exposed remain relatively insoluble to the developer solution. Thus, treatment of an exposed positive-working resist with the developer solution causes removal of the exposed areas of the resist coating and the creation of a positive image in the photoresist coating. The desired portion of the underlying substrate surface is uncovered where the photoresist was exposed to the radiation.

Positive-working photoresist compositions are currently favored over negative-working resists because the former generally have better resolution capabilities and pattern transfer characteristics.

After this development operation, the now partially unprotected substrate may be treated with a substrate-etchant solution or plasma gases and the like. This etchant solution or plasma gases etch the portion of the substrate where the photoresist coating was removed during development. The areas of the substrate are protected where the photoresist coating still remains and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

End users of photoresists are demanding photoresist formulations possess better lithographic properties for the fabrication of smaller microelectronic circuits. The lithographic properties which are critical to positive-working photoresist end-users include the following: (1) good resolution capabilities in both the micron and submicron ranges without incomplete development in the exposed areas (i.e. scumming); (2) higher thermal image deformation temperatures (e.g., above 120° C.); (3) relatively fast photospeeds; (4) good adhesion to substrate; (5) good developer dissolution rates; (6) good process latitude; (7) near to absolute vertical profiles (or good contrast) between exposed and unexposed photoresist areas after development; (8) good resistance to etching solutions and plasma etching techniques; (9) reduced tendency to form insoluble particulates; and (10) mask linearity.

A major problem in VLSI lithographic imaging using conventional photoresists is line width variation caused by scattered light from reflective substrates. To combat this problem, actinic dyes have been added to the photoresist in order to increase the photoresist's absorptivity and reduce scattered light. Conventional actinic dyes have two major drawbacks. One is that they are solubility limited (i.e., their limited solubility in the photoresist also limits the amount of increased absorption which they can provide). A second problem with conventional actinic dyes is that their increased absorption generally corresponds to an undesirable decreased photoresist sensitivity (i.e., decreased photospeed). These two problems are enhanced by the additional fact that there are very few known actinic dyes which absorp at 365±10 nonometers, the wavelength of i-line photoresists.

The present invention is believed to solve these two problems and allows for a particularly effective positive-working i-line photoresist composition.

BRIEF SUMMARY OF THE INVENTION

Accordingly, the present invention is directed to a radiation sensitive composition preferably useful as a dyed i-line positive-working resist comprising an admixture in a solvent of:

(a) at least one photoactive compound;
(b) at least one alkali-soluble binder resin; and
(c) an effective absorbence-increasing amount of an actinic dye having the formula (I):

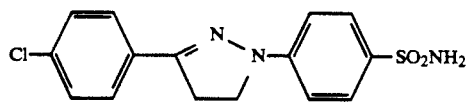

(I)

the amount of said photoactive compound or compounds being about 5% to about 40% by weight; the amount of said binder resin or resins being about 60 to 95% by weight.

Preferably, the amount of the actinic dye is from about 0.2 to about 4% by weight; all based on the total solids content of said radiation sensitive mixture.

Furthermore, the present invention also encompasses the process of coating substrates with these radiation sensitive mixtures and their exposing and developing these coated substrates.

Also further, the present invention encompasses said coated substrates (both before and after imaging) as novel articles of manufacture.

DETAILED DESCRIPTION

As mentioned above, the radiation-sensitive compositions of the present invention have three critical ingredients; at least one alkali-soluble binder resin; at least one photoactive compound; and one particular actinic dye.

Any or all binder resins commonly employed in photoresist compositions may be used herein. The preferred class of binder resins is alkali-soluble resin or resins which are useful in positive-working photoresist compositions. The term "alkali-soluble binder resin" is used herein to mean a resin which will dissolve completely in an aqueous alkaline developing solution conventionally used with positive-working photoresist compositions. Suitable alkali-soluble resins include phenolic novolaks such as phenolformaldehyde novolak resins, cresol-formaldehyde novolak resins, or polyvinyl phenol resins, preferably those having an average molecular weight of about 500 to about 40,000, and more preferably from about 800 to 20,000. The novolak resins are preferably prepared by the condensation reaction of phenol or cresols with formaldehyde and are characterized by being light-stable, water-insoluble, alkali-soluble, and film-forming. The most preferred class of novolak resins is formed by the condensation reaction between a mixture of meta- and para-cresols with formaldehyde.

Any and all photoactive compounds which make radiation-sensitive mixtures useful as photoresists may be employed herein. The preferred class of photoactive compounds (sometimes called "sensitizers") is o-quinonediazide compounds, particularly esters derived from polyhydric phenols, alkyl-polyhydroxyphenones, aryl-polyhydroxyphenones, and the like which can contain up to six or more sites for esterification. The most preferred o-quinonediazide esters are derived from 3-diazo-3,4-dihydro-4-oxo-naphthalene-1-sulfonic acid chloride (also know as 1,2-naphthoquinonediazide-4-sulfonyl chloride) and 6-diazo-5,6-dihydro-5-oxonaphthalene-1-sulfonic acid chloride (also known as 1,2-naphthoquinonediazide-5-sulfonyl chloride).

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4-dihydroxyphenyl hexyl ketone 1,2-naphthoquinone-diazide-4-sulfonic acid esters, 2,4-dihydroxy-benzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide- 4-sulfonic acid esters, 2,3,4-trihydroxybenzophenone 1,2-naphthoquinonediazide-5-sulfonic acid esters, 2,4,6-trihydroxybenzophenone 1,2-naphthoquinone-diazide-4-sulfonic acid esters, 2,4,6-trihydroxybenzophenone 1,2-naphthoquinonediazide-5-sulfonic acid esters, 2,2',4,4'-tetrahydroxybenzophenone 1,2-naphthoquinonediazide-5-sulfonic acid esters, 2,3,4,4'-tetrahydroxy-benzophenone, 1,2-naphthoquinonediazide-5-sulfonic acid esters, 2,3,4,4'-tetrahydroxy-benzophenone 1,2-naphthoquinonediazide-4-sulfonic acid esters, 2,2',3,4',6'-pentahydroxybenzophenone 1,2-naphthoquinone-diazide-5-sulfonic acid esters, and 2,3,3',4,4',5'-hexahydroxybenzophenone 1,2-naphthoquinonediazide-5-sulfonic acid esters; 1,2-quinonediazidesulfonic acid esters of bis[(poly)-hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide 4-sulfonic acid esters, 2,2-bis(2,4-dihydroxyphenyl)propane 1,2-naphthoquinone-diazide-5-sulfonic acid esters and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, arylpolyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta-, and hexa-esters of polyhydroxy compounds having at least 2 hydroxyl groups, i.e., about 2 to 6 hydroxyl groups, are one class of preferred compounds.

Among this class of preferred 1,2-naphthoquinonediazide compounds are 2,3,4-trihydroxybenzophenone 1,2-naphthoquinone-diazide-5-sulfonic acid esters, 2,3,4,4'-tetrahydroxy-benzophenone 1,2-naphthoquinonediazide-5-sulfonic acid esters, and 2,2',4,4'-tetra-hydroxybenzo-phenone 1,2-naphthoquinonediazide-5-sulfonic acid esters. Another preferred 1,2-quinonediazide compound is mixed 1,2-naphthoquinonediazide-5-sulfonic acid esters of 2,2'3,3'-tetrahydro-3,3,3'3'-tetramethyl-1,1-spirobi (1H-indene)-5,5'6,6'7,7'-hexol (C.A.S. Reg. No. 32737-33-0). These 1,2-naphthoquinonediazide compounds may be used alone or in combination of two or more.

Another preferred 1,2-naphthoquinone-5-diazide compounds are phenol 1,2-naphthoquinonediazide-5-sulfonic acid ester and bis[4-(2,6-dimethylphenol)]-4-catehol methane 1,2-naphthoquinone-5-diazide sulfonic acid esters. Still other preferred 1,2-naphthoquinone-5-diazide compounds are bis(2,6-dimethyl-4-hydroxyphenyl)(3-methoxy-4-hydroxyphenyl) methane esterified with up to three equivalents of 1,2-naphthoquinone-5-sulfonyl chloride and bis(2,6-dimethyl-4-hydroxyphenyl)(3,4-dihydroxyphenyl)methane esterified with four equivalents of 1,2-naphthoquinone-diazide-5-sulfonyl chloride. Mixtures of these latter two sensitizers may also be used.

Another preferred class of photoactive o-quinonediazide compounds is prepared by condensing spirobiindane or spirobichroman derivatives with 1,2-naphthoquinonediazido-4-sulfonyl chloride or 1,2-naphthoquinonediazide-5-sulfonyl chloride or a mixture thereof to make compounds of formula (A) shown below:

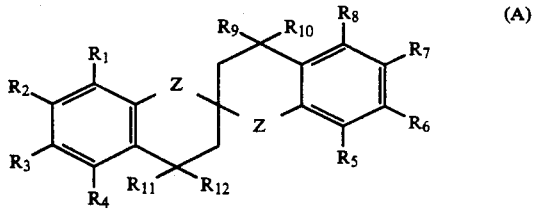

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group,—OD or

wherein R is hydrogen, or an alkyl group, and D is a 1,2-naphthoquinonediazido-5-sulfonyl group or a 1,2-naphthoquinonediazido-4-sulfonyl group); $R_9$ to $R_{12}$ are independently hydrogen or a lower alkyl group; and Z is oxygen or a single bond (i.e. the latter forms a five-member ring); provided that at least one of $R_1$ to $R_8$ is

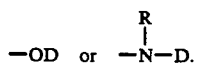

The halogen represented by $R_1$ to $R_8$ in the formula (A) is preferably chlorine, bromine or iodine.

The alkyl group is preferably an alkyl group having 1 to 4 carbon atoms, such as methyl, ethyl, propyl, isopropyl, n-butyl, isobutyl, sec-butyl and tert-butyl.

The alkoxy group is preferably an alkoxy group having 1 to 4 carbon atoms, such as methoxy, ethoxy, hydroxyethoxy, propoxy, hydroxypropoxy, isopropoxy, n-butoxy, isobutoxy, sec-butoxy and tert-butoxy.

The aralkyl group is preferably a benzyl group, a phenethyl group or a benzhydryl group.

The aryl group is preferably phenyl, tolyl, hydroxyphenyl or naphthyl.

The monoalkylamino group is preferably a monoalkylamino group having 1 to 4 carbon atoms, such as monomethylamino, monoethylamino, monopropylamino, monoisopropylamino, mono-n-butylamino, monoisobutylamino, mono-sec-butylamino, or mono-tert-butylamino.

The dialkylamino group is preferably a dialkylamino group with each akyl substituent having 1 to 4 carbon atoms, such as dimethylamino, diethylamino, dipropylamino, di-isopropylamino, di-n-butylamino, di-iso-butylamino, di-sec-butylamino, or di-tert-butylamino.

The acylamino group is preferably an aliphatic group-substituted acylamino group such as acetylamino, propionylamino, butylamino, isobutylamino, isovalerylamino, pivaloylamino or valerylamino, or an aromatic group-substituted acylamino group such as benzoylamino or toluoylamino.

The alkylcarbamoyl group is preferably an alkylcarbamoyl group having 2 to 5 carbon atoms, such as methylcarbamoyl, ethylcarbamoyl, propylcarbamoyl, isopropylcarbamoyl, n-butylcarbamoyl, isobutylcarbamoyl, sec-butylcarbamoyl, or tert-butylcarbamoyl.

The arylcarbamoyl group is preferably phenylcarbamoyl or tolylcarbamoyl.

The alkylsulfamoyl group is preferably an alkylsulfamoyl group having 1 to 4 carbon atoms, such as methylsulfamoyl, ethylsulfamoyl, propylsulfamoyl, isopropylsulfamoyl, n-butylsulfamoyl, sec-butylsulfamoyl, or tert-butylsulfamoyl.

The arylsulfamoyl group is preferably phenylsulfamoyl or tolylsulfamoyl.

The acyl group is preferably an aliphatic acyl group having 1 to 5 carbon atoms, such as formyl, acetyl, propionyl, butyryl, isobutyryl, valeryl, isovaleryl or pivaloyl, or an aromatic acyl group, such as benzoyl, toluoyl, salicyloyl, or naphthoyl.

The alkyloxycarbonyl group is preferably an alkyloxycarbonyl group having 2 to 5 carbon atoms, such as methoxycarbonyl, ethoxycarbonyl, propoxycarbonyl, isopropoxycarbonyl, n-butoxycarbonyl, isobutoxycarbonyl, sec-butoxycarbonyl, or tert-butoxycarbonyl.

The aryloxycarbonyl group is preferably phenoxycarbonyl.

The acyloxy group is preferably an aliphatic acyloxy group having 2 to 5 carbon atoms, such as acetoxy, propionyloxy, butyryloxy, isobutyryloxy, valeryloxy, isovaleryloxy or pivaloyloxy, or an aromatic acyloxy group such as benzoyloxy, toluoyloxy, or naphthoyloxy.

The lower alkyl group represented by $R_9$ to $R_{12}$ in the formula (A) is preferably an alkyl group having 1 to 4 carbon atoms, such as methyl, ethyl, propyl, isopropyl, butyl, isobutyl, sec-butyl, or tert-butyl.

In the formula (A) above, $R_1$ to $R_8$ are preferably a hydrogen atom, a hydroxy group or an —OD group wherein D is as defined above, and $R_9$ to $R_{12}$ are preferably a hydrogen atom or a methyl group. R is preferably an alkyl group having 1 to 4 carbon atoms, such as a methyl, ethyl, n-propyl, isopropyl, n-butyl, isobutyl, sec-butyl, or t-butyl group.

The proportion of the photoactive compound in the radiation-sensitive mixture may range from about 5% to about 40%, more preferably from about 10% to about 25% by weight of the nonvolatile (e.g., nonsolvent) content of the radiation-sensitive mixture. The proportion of total binder resin of this present invention in the radiation-sensitive mixture may range from about 60% to about 95%, preferably, from about 75% to 90% by weight, of the nonvolatile (e.g., excluding solvents) content of the radiation-sensitive mixture.

The third critical ingredient of the radiation-sensitive composition of the present invention is the BLANKO-PHOR FBW dye which has the chemical formula (I) above. This actinic dye is made by Mobay Chemical of Pittsburgh, Pa., and is known by its Chemical Abstract No. 2799-49-2. Its chemical abstract index name is benzenesulfonamide, 4-[3-(4-chlorophenyl)-4,5-dihydro-1H-pyrazol-1-yl]. It other chemical names include 1-(p-sulfamoylphenyl)-3-(p-chlorophenyl)-2-pyrazoline; 3-(p-chlorophenyl)-1-(p-sulfamidophenyl)-2-pyrazoline; and 3-(4-chlorophenyl-1-4-sulfamoylphenyl)-2-pyrazoline. It has been used as a fluorescent brightener for detergents and textiles.

For the present invention, it has been found that BLANKOPHOR FBW dye does not saturate quickly in a novolak/quinone diazide-type photoresist solution, thus allowing for its relatively high loading (i.e., in other words, it is quite soluble in conventional positive-working i-line photoresists). Photoresists having high absorbance at 365±10 nonometers can be obtained by addition of the BLANKOPHOR FWB dye. Also, this dye not only increases absorptivity, it also increases the photosensitivity of the photoresist. This latter behavior is unique and totally unexpected. Still further, this dye is soluble in conventional alkaline photoresist developers, thus aiding in the dissolution rate and increasing the photosensitivity.

The preferred proportion of this dye in the radiation-sensitive mixture may range from about 0.4% to about 2%, most preferably about 0.8% to 1.6% by weight of the nonvolatile (e.g., excluding solvents) content of the radiation-sensitive mixture.

These radiation-sensitive mixtures may also contain, besides the resin, photoactive compound and dye, conventional photoresist composition ingredients such as other resins, solvents, other actinic dyes, contrast dyes, anti-striation agents, plasticizers, other sensitivity enhancers, and the like. These additional ingredients may be added to the binder resin, photoactive compound and polylactide compound solution before the solution is coated onto the substrate.

The binder resin, photoactive compound or sensitizer, and actinic dye may be dissolved in a solvent or solvents to facilitate their application to the substrate. Examples of suitable solvents include methoxyacetoxy propane, diglyme, toluene, ethyl cellosolve acetate, n-butyl acetate, ethyl lactate, propylene glycol alkyl ether acetates, or mixtures thereof and the like. Cosolvents such as xylene, n-butylacetate, or ethyl ethoxy propionate or the like may also be used. The most preferred solvent is ethyl lactate (EL) alone or in combination with another solvent (e.g., ethyl 3-ethoxy propionate) (EEP). If the latter two solvents are used in combination, they may be used in weight ratios of about 5:5 to 8:2 EL:EEP. The preferred amount of solvent may be from about 50% to about 500%, or higher, by weight, more preferably, from about 100% to about 400% by weight, based on combined resin, sensitizer, and dye weight.

Examples of other actinic dyes include those that absorb light energy at approximately 400–460 nm [e.g., Fat Brown B (C.I. No. 12010); Fat Brown RR (C.I. No. 11285); 2-hydroxy-1,4-naphthoquinone (C.I. No. 75480) and Quinoline Yellow A (C.I. No. 47000) and Macrolex Fluoroyellow 10GN (C.I. No. Solvent Yellow 16:1)] and those that absorb light energy at approximately 300–340 nm [e.g. 2,5-diphenyloxazole (PPO-Chem. Abs. Reg. No. 92-71-7) and 2-(4-biphenyl)-6-phenylbenzoxazole (PBBO-Chem. Abs. Reg. No. 17064-4-7-0)]. The amount of the other actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to 10% weight levels, based on the combined weight of resin and sensitizer.

Anti-striation agents level out the photoresist coating or film to a uniform thickness. Anti-striation agents may be used up to five percent by weight levels, based on the combined weight of resin and sensitizer. One suitable class of anti-striation agents is nonionic silicon-modified polymers. Nonionic surfactants may also be used for this purpose.

The photoresist coatings produced by the above described procedure are particularly suitable for application to silicon/silicon dioxide-coated or polysilicon or silicon nitride wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate may be preferably baked at approximately 70° to 125° C. until substantially all the solvent has evaporated and only a uniform radiation-sensitive coating remains on the substrate.

The coated substrate can then be exposed to radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light and electron beam radiations are the preferred sources of radiation, other sources such as visible light, ion beam, and X-ray radiant energy may be instead used. In some instances, a post-exposure bake at a temperature about 10° C. higher than the soft bake temperature for about 30–300 seconds is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In the manufacture of microcircuitry units, the developed substrates may then be treated with a plasma gas etch employing conventional plasma processing parameters (e.g., pressure and gas flow rates) and conventional plasma equipment.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLES 1-4

Solutions of anti-reflective dyes listed in Table 1 below were prepared by dissolving a specified weight percentage of dye to a positive-working photoresist solution. The positive-working photoresist mixture referred to as RX-3900 consisted of (1) a selected novolak resin, (2) a photoactive compound (PAC), (3) a speed enhancing agent (SE), (4) a leveling agent, and (5) coating solvents by the following general procedure. These five components were used to make a photoresist mixture (RX-3900) in which an anti-reflective dye was added to the resist example. The novolak resins consisted of selected mixtures of monofunctional and difunctional phenolic monomers and phenolic dimers, referred to as structure novolak. The PAC consisted of bis(2,6-dimethyl-4-hydroxyphenyl)(3-methoxy-4-hydroxyphenyl)methane esterified with three equivalents of 1,2-naphthoquinonediazide-5-sulfonyl chloride (referred to as PS-11). The speed enhancing agent used in each photoresist was 1-[1'-methyl-1'-(4-hydroxyphenyl)ethyl]4-[1',1'-bis-(4hydroxyphenyl)ethyl]benzene (referred to as TRISP-PA). The solvent used in the photoresist mixture consisted of an 80/20 weight percentage mixture of ethyl lactate and ethyl 3-ethoxypropionate respectively. An alkyl resin/silicone surfactant level agent (FLUORAD FC-430 produced by 3M) was added to each photoresist composition.

The photoresist mixture (RX-3900) was then modified with the addition of an anti-reflective dye as shown in Table 1.

TABLE 1

| Resist Example | Percentage of RX-3900 | Percentage of Dye | Dye Type | Eopt mJ/sq cm | Resolution microns | B-Value |
|---|---|---|---|---|---|---|
| 1 | 100 | 0 | None | 180 | 0.40 | 0.09 |
| 2 | 99.7 | 0.3 | F-8 | 200 | 0.40 | 0.35 |
| 3 | 99.8 | 0.2 | D-3 | 240 | 0.50 | 0.38 |
| 4 | 99.7 | 0.3 | FBW | 130 | 0.42 | 0.30 |

F-8 is 2-4'-N,N-dibutylamino)-2'-hydroxybenzoylbenzoic acid (C.A. No. 54574-82-2). D-3 is Kodak Dye D-3 whose chemical name is N,N'-dibutyl-N,N'-di(1-(4,4-dicyano-1,3-dicyano-1,3-butadiene))-1,6-hexanediamine. FBW refers to BLANKOPHOR FBW.

Examples 2-4 show the effect of three different dye structures when added to photoresist. In all three cases, the dye increased the B-Value at 365 nm, compared to the undyed sample. Therefore, these dyed resist samples are desirable for highly reflective substrates in order to reduce scattering of light off the substrate. The back scattering causes the undesirable effect of optical notching, especially on a substrate with topography.

Typically, the incorporation of an actinic dye reduces the photosensitivity of the resist sample, as seen in Examples 2 and 3. The incorporation of the FBW dye not only minimizes the loss in sensitivity with dye incorporation, but surprisingly enhances the photosensitivity of the resist.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. The process of developing an image-wise exposed photoresist-coated substrate comprising:
   (1) coating said substrate with a radiation-sensitive composition useful as a photoresist, said composition comprising an admixture in a solvent of:
      (a) at least one alkali-soluble binder resin;
      (b) at least one photoactive o-quinonediazide compound; and
      (c) an effective absorbence-increasing amount of an actinic dye having the formula (I):

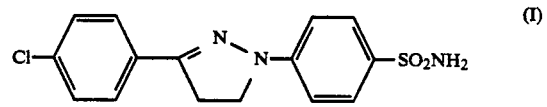

the amount of said binder resin being about 60 to 95% by weight, the amount of said photoactive component being about 5% to about 40% by weight, based on the total solids content of said radiation-sensitive composition;

(2) subjecting said coating on said substrate to an image-wise exposure of radiant light energy at a wavelength of 365±10 nonometers; and (3) subjecting said image-wise exposed coated substrate to a developing solution to form an image-wise pattern in the coating.

2. The process of claim 1 wherein said alkali-soluble binder resin is a novolak resin.

3. The process of claim 1 wherein said photoactive o-quinonediazide compound or compounds are present in the amount of about 10% to about 25% by weight, said binder resin is present in the amount of about 75% to about 90% by weight, and said due is present in the amount of 0.2% to about 4% by weight, all based on the total solids content of said radiation-sensitive composition.

4. The process of claim 3 wherein said dye is present in the amount of from about 0.4% to about 2% by weight, based on the total solids content of said radiation-sensitive composition.

5. The process of claim 1 wherein said radiation-sensitive composition further comprises solvents, other actinic dyes, visual contrast dyes, plasticizers, anti-striation agents, and speed enhancers.

* * * * *